(12) United States Patent
Takahashi (10) Patent No.: US 7,965,140 B2
(45) Date of Patent: Jun. 21, 2011

(54) POWER AMPLIFIER

(75) Inventor: Kiyohiko Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 153 days.

(21) Appl. No.: 12/523,576

(22) PCT Filed: Dec. 28, 2007

(86) PCT No.: PCT/JP2007/075266
§ 371 (c)(1),
(2), (4) Date: Jul. 17, 2009

(87) PCT Pub. No.: WO2008/090721
PCT Pub. Date: Jul. 31, 2008

(65) Prior Publication Data
US 2010/0019840 A1    Jan. 28, 2010

(30) Foreign Application Priority Data
Jan. 24, 2007 (JP) ................................ 2007-013738

(51) Int. Cl.
*H03G 3/20* (2006.01)
(52) U.S. Cl. ........................... 330/136; 330/297; 330/10
(58) Field of Classification Search ................... 330/136, 330/297, 10
See application file for complete search history.

(56) References Cited

U.S. PATENT DOCUMENTS

| | | | | |
|---|---|---|---|---|
| 6,160,449 | A * | 12/2000 | Klomsdorf et al. | 330/149 |
| 6,166,598 | A * | 12/2000 | Schlueter | 330/127 |
| 6,256,482 | B1 * | 7/2001 | Raab | 455/108 |
| 7,043,213 | B2 * | 5/2006 | Robinson et al. | 455/127.2 |
| 7,123,664 | B2 * | 10/2006 | Matero | 375/295 |
| 7,684,514 | B2 * | 3/2010 | Saito et al. | 375/297 |
| 2010/0266066 | A1 * | 10/2010 | Takahashi | 375/295 |

FOREIGN PATENT DOCUMENTS

| | | |
|---|---|---|
| JP | 1987060306 A | 3/1987 |
| JP | 1991174810 A | 7/1991 |
| JP | 1998256843 A | 9/1998 |
| JP | 2001156554 A | 6/2001 |
| JP | 2003304127 A | 10/2003 |
| JP | 2004173249 A | 6/2004 |

(Continued)

OTHER PUBLICATIONS

International Search Report for PCT/P2007/075266 mailed Apr. 8, 2008.

(Continued)

*Primary Examiner* — Patricia Nguyen (57) ABSTRACT

A power amplifier is provided with an AD converter pulse modulating an envelope signal extracted from a high frequency modulation signal; a switching amplifier amplifying an output signal from the AD converter; a low-pass filter removing high frequency noise from an output signal from the switching amplifier; a voltage control device controlling a power supply voltage of the switching amplifier; and a high frequency amplifier amplifying a phase-modulated signal having a constant envelope and having output from the low-pass filter as a power supply. The average power of the envelope signal to be inputted to the AD converter is permitted to be constant so that an input dynamic range of the AD converter can be most efficiently used. In addition the average power of the output signal from the power amplifier is adjusted by a power supply voltage to be supplied to the switching amplifier.

15 Claims, 6 Drawing Sheets

FOREIGN PATENT DOCUMENTS

| | | | |
|---|---|---|---|
| JP | 2005277559 | A | 10/2005 |
| JP | 2005295523 | A | 10/2005 |
| JP | 2006093872 | A | 4/2006 |
| JP | 2006246028 | A | 9/2006 |
| WO | 2005011109 | A | 2/2005 |
| WO | 2005074125 | A | 8/2005 |

OTHER PUBLICATIONS

O. Bajdechi et al., "Systematic Design of Sigma-Delta Analog-To-Digital Converters", Kluwer Academic Publishers, 2004. p. 16-17.

J. V. Engelen et al., "Bandpass Sigma Delta Modulators", Kluwer Academic Publishers, 1999, p. 46-47.

* cited by examiner

POWER AMPLIFIER

This application is the National Phase of PCT/R2007/075266, filed Dec. 28, 2007, which is based upon and claims the priority of Japanese Patent Application No. 2007-013738 filed on Jan. 24, 2007, the disclosures of which are herein incorporated by reference.

TECHNICAL FIELD

The present invention relates to a high efficient polar modulation type of power amplifier whose linearity is not changed even when the average power of an input/output signal is changed.

BACKGROUND ART

In recent years, a certain kind of communication that is used in wireless communications, such as cellular phones and the like, achieves high utilization efficiency of frequency band, and has a high PAPR (Peak to Average Power Ratio) in a wireless signal. In order to amplify a signal having an amplitude modulation component using an AB-grade amplifier which has been conventionally used in an art of wireless communication, it is necessary to be operated in an enough backoff state for maintain linearity In general, the back off that is same as at least the PAPR is required.

Regarding this, the efficiency of an AB-grade amplifier is best in a saturation state and is decreased as the back off is increased. Due to this, for a high frequency modulation signal having a high PAPR, it is difficult to improve the power efficiency of the power amplifier.

As a power amplifier that amplifies a high frequency modulation signal having a high PAPR at a high-efficiency, there is a polar modulation type of power amplifier. The polar modulation type of power amplifier is used to amplify a high frequency modulation signal that is a wireless communication signal, which includes amplitude modulation and phase-modulated components generated with polar coordinates comprised of amplitude and phase components. The polar modulation type of power amplifier includes an EER (Envelope Elimination and Restoration) system of power amplifier, which can be substituted for the AB-grade amplifier.

Figure 1:
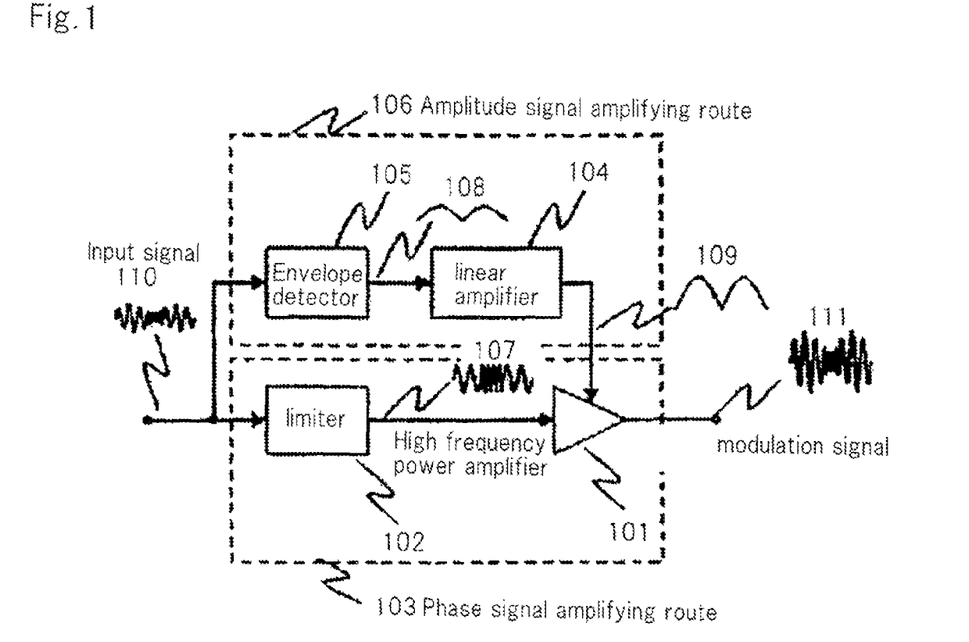
FIG. 1 is a block diagram showing a structure of an EER type of power amplifier according to the prior art.

FIG. 1 is a block diagram showing a structure of an EER type-power amplifier according to the prior art.

As shown in FIG. 1, signal 110 inputted to an EER type of power amplifier is divided into amplitude signal amplifying route 106 and phase signal amplifying route 103.

In amplitude signal amplifying route 106, envelope detector 105 extracts envelope signal 108 (amplitude modulation component) from input signal 110, which is then amplified in linear amplifier 104. In phase signal amplifying route 103, limiter 102 extracts phase-modulated signal (phase-modulated component) 107 having a constant envelope from input signal 110, which is then amplified in high frequency amplifier 101.

To high frequency amplifier 101 is provided, as a power supply, output signal 109 of amplitude signal amplifying route 106. High frequency amplifier 101 is biased with output signal 109 of amplitude signal amplifying route 106, so that it always operates in a saturation state, thereby outputting modulation signal 111 having synthesized the phase-modulated signal and the envelope signal.

The reason why the EER type of power amplifier, shown in FIG. 1, can improve power efficiency is because it uses a high efficient switching amplifier, such as linear amplifier 104 and because it enables high frequency amplifier 101 always operate in a saturation state.

Figure 2:
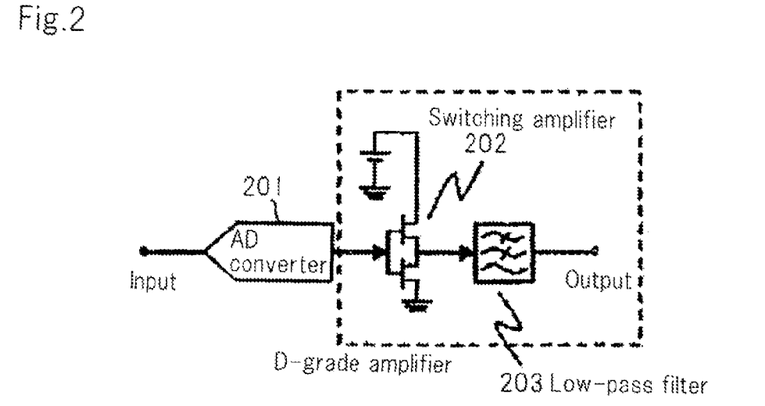
FIG. 2 is a block diagram showing an example of the linear amplifier shown in FIG. 1.

A typical example of linear amplifier 104 shown in FIG. 1 is shown in FIG. 2.

A signal band treated in amplitude signal amplifying route 106 shown in FIG. 1 is approximately same as a signal band of input signal 110, which is typically several hundreds kHz to several tens MHz. Due to this, linear amplifier 104 can be structured with a D-grade amplifier comprising AD (Analog to Digital) converter 201 that converts envelope signal 108 into a bit stream signal using PDM (Pulse Density Modulation) and the like, switching amplifier 202 and low-pass filter 203, as shown in FIG. 2. Ideally, there occurs no power loss in the linear amplifier.

Furthermore, general high frequency amplifier 101 has a characteristic in which it most efficiently operates in a saturation state. The power efficiency of an EER type-power amplifier is the product of the efficiency of linear amplifier 104 and the efficiency of high frequency amplifier 101.

The EER type of power amplifier shown in FIG. 1 has a tendency in which the efficiency thereof is decreased when the average power of modulation signal 111 is small. Due to this, a variety of attempts have been made to improve the efficiency of the EER type-power amplifier. For example, an EER type of power amplifier of the background disclosed in a Japanese Unexamined Patent Publication No. 2003-304127 is shown in FIG. 3.

Figure 3:
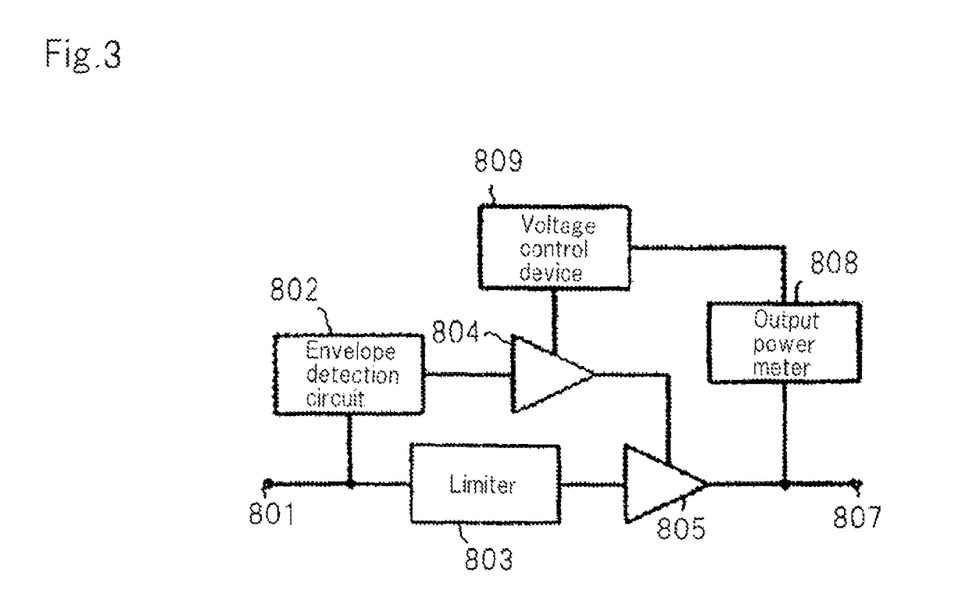
FIG. 3 is a block diagram showing another example of an EER type of power amplifier according to the prior art.

A circuit shown in FIG. 3 comprises voltage control device 809 and output power meter 808, which are added to the circuit shown in FIG. 1. A signal inputted from input terminal 801 is inputted to envelope detector 802 and limiter 803. From the signal inputted to envelope detector 802, only an envelope signal is extracted and outputted to linear amplifier 804. Linear amplifier 804 amplifies the inputted envelope signal inputted and outputs the amplified signal to high frequency amplifier 805 as a power supply voltage.

The signal inputted to limiter 803 is converted into a phase-modulated signal having a constant envelope, which is then outputted to high frequency amplifier 805. High frequency amplifier 805 multiplies the envelope signal outputted from linear amplifier 804 by the phase-modulated signal outputted from limiter 803, and outputs the multiplied signal.

The output signal from high frequency amplifier 805 is outputted to output terminal 807 and is supplied to output power meter 808. Output power meter 808 detects an output power of high frequency amplifier 805 and provides voltage control device 809 with information of the detected output power.

Voltage control device 809 controls a power supply voltage that is supplied to linear amplifier 804, based on the information received from output power meter 808. Linear amplifier 804 has a PWM (Pulse Width Modulation) circuit, a switching amplifier and an output filter.

The power amplifier shown in FIG. 1 has the problem in which the efficiency of linear amplifier 104 is lowered when the average power of modulation signal 111 is small, thereby lowering the efficiency of the overall circuit. Meanwhile, in the power amplifier shown in FIG. 3, the power supply of linear amplifier 804 is supplied from voltage control device 809 and the power supply voltage of linear amplifier 804 is changed depending on the output power of high frequency amplifier 805, thereby preventing the efficiency from being lowered.

The EER type of power amplifier shown in FIG. 1 has the problem in which when the average power of modulation signal 111, which is the output signal from the power amplifier, is small, the SNR (Signal to Noise Ratio) thereof is poor, in addition to the above problem in which the efficiency is lowered. This is because the quantization noise of AD converter 201 provided to linear amplifier 104 is constant regardless of the magnitude of envelope signal 108 to be inputted.

In the meantime, the power amplifier shown in FIG. 3 has the problem in which a gain of the overall circuit is varied depending on the output power of high frequency amplifier 805. This is because a gain of the PWM circuit is varied by the power supply voltage. Japanese Patent Laid-Open No. 2003-304127 does not disclose a specific method that solves the above problems. As a result, it is not possible to make the gain of the power amplifier as a desired value and thus it is not possible to make the power of the output signal from the power amplifier as a desired value.

SUMMARY

Hence, an exemplary object of the invention is to provide a power amplifier capable of maintaining a SNR of an output signal to be constant regardless of the output power.

Another exemplary object of the invention is to provide a power amplifier capable of adjusting output power to a desired value.

In order to achieve the above object, the exemplary aspect of the invention provides a power amplifier of the invention includes a route for amplifying an envelope signal included in an inputted high frequency modulation signal and a route for amplifying a phase-modulated signal. In the route for amplifying the envelope signal, there is provided an AD converter pulse modulating the envelope signal, a switching amplifier amplifying an output signal from the AD converter, a low-pass filter removing high frequency noise from the output signal from the switching amplifier, and a voltage control device controlling a power supply voltage of the switching amplifier.

In the route for amplifying the phase-modulated signal, there is provided a high frequency amplifier amplifying a phase-modulated signal having a constant envelope and using output from the low-pass filter that act as a power supply.

In the power amplifier of the invention, a SNR of an output signal is not changed even when an output power is varied. This is because a SNR of the AD converter, which is provided to the route for amplifying the envelope signal, is always made to be constant. The reason is as follows.

Figure 4:
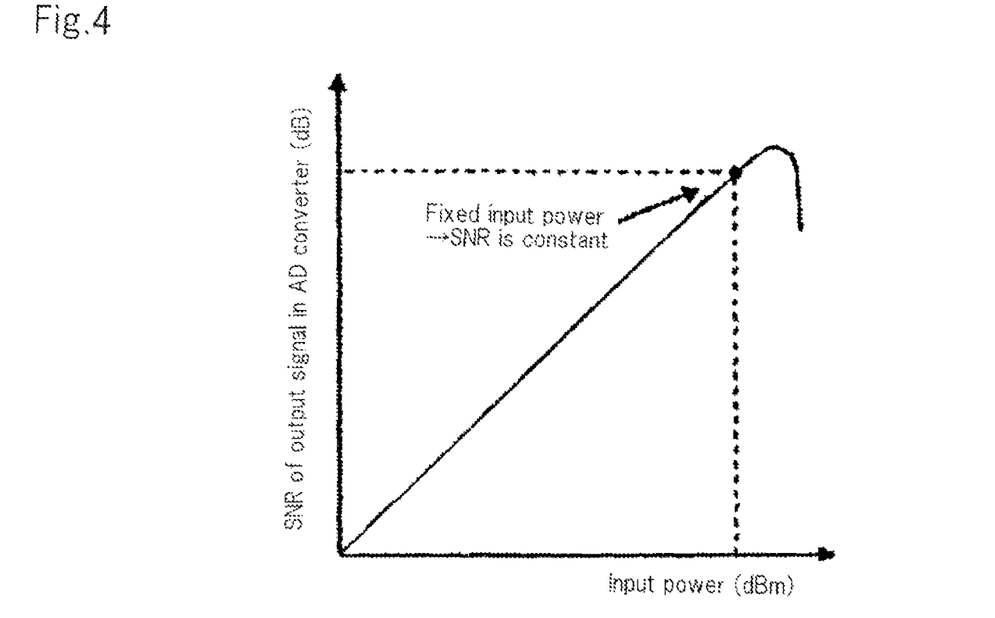
FIG. 4 is a graph showing the relation between an input signal and a SNR of an output signal in an AD converter.

FIG. 4 shows the relation between the magnitude of an input signal and the SNR of an output signal in an ideal AD converter.

The SNR (dB) of an output signal from an ideal AD converter can be expressed with a linear function of power (dBm) of an input signal, within a non-saturated input range. This is also found in "FIG. 2.6 in Systematic Design of Sigma-Delta Analog-to-Digital Converters (Ovidiu Baidechi and Johan H. Huijsing; Kluwer Academic Publishers)" or "FIG. 4.7 in Bandpass Sigma Delta Modulators (Jurgen van Engelen and Rudy van de Plassche; Kluwer Academic Publishers)."

The envelope signal is inputted to the AD converter, in which it is then converted into a pulse-modulated signal. According to the invention, the average power of the envelope signal to be inputted to the AD converter is permitted to be constant with power control device so that the input dynamic range of the AD converter can be most efficiently used. Due to this, the SNR of the output signal from the AD converter is always constant. The output signal from the AD converter is inputted and then amplified in the switching amplifier. The output from the switching amplifier is supplied, as a power supply voltage, to the high frequency amplifier via the low-pass filter. The SNR of the output signal from the low-pass filter is determined by the SNR of the output signal from the AD converter. Hence, the SNR of the output signal from the low-pass filter is always constant.

In the meantime, a gain of the switching amplifier is changed in accordance with a power supply voltage to be applied. Thus, according to the invention, there is provided a voltage control device that controls the power supply voltage to be supplied to the switching amplifier. The output power of a polar modulation type of power amplifier is determined by the output power of the route for amplifying the envelope signal. According to the invention, the average power of the output signal from the power amplifier is adjusted by the power supply voltage to be supplied to the switching amplifier.

Figure 5:
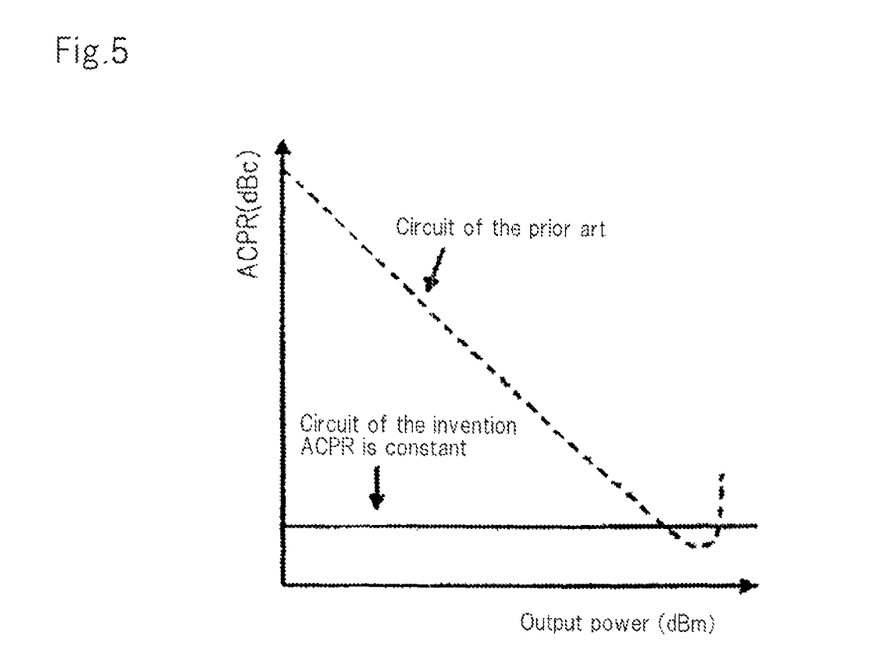
FIG. 5 is a graph showing the relation between an average power of an output signal and an ACPR of an output signal in the power amplifiers according to the invention and the prior art.

The relations between the average power of an output signal and the ACPR (Adjacent Channel Power Ratio) of an output signal in the power amplifiers according to the invention and the prior art are shown in FIG. 5.

In the EER type of power amplifier according to the prior art, when the average power of the output signal is decreased, the ACPR of the output signal is increased. This is because the input signal to the AD converter is made to be small so as to lower the average power of the output signal and the SNR of the output signal from the AD converter is resultantly lowered. In the power amplifier of the invention, the average power of the input signal to the AD converter is permitted to be constant and the output power is adjusted with the gain of the switching amplifier. Due to this, the ACPR of the output signal is ideally constant all the time.

According to the invention, in the route for amplifying the envelope signal, the average power of the input signal to the AD power is permitted to be constant and the SNR of the output signal from the AD converter is made to be always constant, so that it is possible to realize an EER type of power amplifier having the SNR of the output signal, which is always constant.

In addition in the rout for amplifying the envelope signal, the power supply voltage of the switching amplifier is controlled to adjust the gain of the switching amplifier, so that it is possible to realize an EER type of power amplifier capable of adjusting the average power of an output signal thereof.

EXEMPLARY EMBODIMENT

Hereinafter, the invention will be more specifically described with reference to the drawings.

Figure 6:
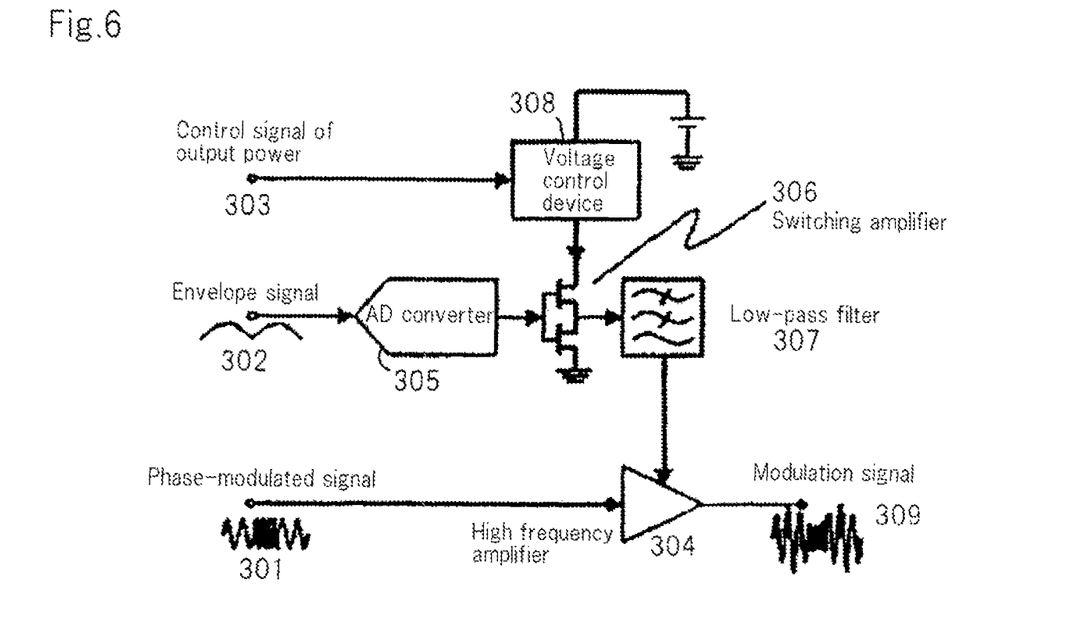
FIG. 6 is a block diagram showing a structure of a power amplifier according to an exemplary embodiment of the invention.

As shown in FIG. 6, a power amplifier of this exemplary embodiment has terminals to which three types of signals, i.e., phase-modulated signal 301, envelope signal 302 and control signal 303 of output power are inputted.

Phase-modulated signal 301 corresponds to phase-modulated signal 107 in the power amplifier shown in FIG. 1. Envelope signal 302 corresponds to envelope signal 108 in the power amplifier shown in FIG. 1. In this exemplary embodiment, envelope signal 302 is permitted to be a signal having an average power that is always constant. Control signal 303 has information for controlling modulation signal 309, which is an output signal from the power amplifier, as a desired average power.

Phase-modulated signal 301 is inputted and then amplified in high frequency amplifier 304. Envelope signal 302 is amplified by AD converter 305, switching amplifier 306 and low-pass filter 307, and then outputted as a power supply of high frequency amplifier 304. Control signal 303 is inputted to voltage control device 308 and an output signal from voltage control device 308 becomes a power supply voltage of switching amplifier 306. An output voltage of voltage control device 308 is controlled by control signal 303. High frequency amplifier 304 multiplies phase-modulated signal 301 by an output signal from low-pass filter 307, and outputs modulation signal 309 after having synthesized the signals.

In the power amplifier of this exemplary embodiment, the average power of envelope signal 302 is permitted to be constant so that an input dynamic range of AD converter 305 can be most effectively used. Hence, the SNR of the output signal from AD converter 305 is always constant regardless of the average power of modulation signal 309.

Furthermore, in the power amplifier of this exemplary embodiment, the average power of modulation signal 309 is adjusted by changing an output amplitude from switching amplifier 306. An output amplitude from switching amplifier 306 is determined by a power supply voltage to be supplied from voltage control device 308.

In the above-mentioned power amplifier, the SNR is not ideally changed by the average power of modulation signal 309. This is because the average power of the input signal to AD converter 305 is permitted to be constant, so that the SNR of the modulation signal is made to be always constant.

In the power amplifier shown in FIG. 1, since the SNR of AD converter 201 is decreased at a low output power, the ACPR is increased. This is because the input signal to AD converter 201 is made to be small so as to lower the average power of the output signal from the power amplifier and the SNR of the output signal from AD converter 201 is resultantly lowered. In the power amplifier of this exemplary embodiment, since the average power of the input signal to AD converter 305 is permitted to be constant, the ACPR of the output signal is ideally constant all the time.

Meanwhile, in the power amplifier of this exemplary embodiment, the average power of the input signal to AD converter 305 may be changed into a step or saw shape in a predetermined range in accordance with desired output powers, by using a control circuit having a look-up table, for example. An example of a structure having the look-up table is shown in FIG. 7.

Figure 7:
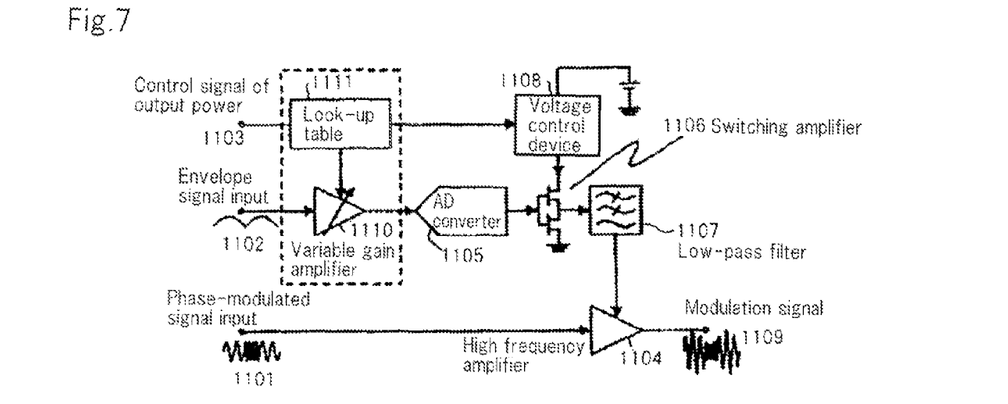
FIG. 7 is a block diagram showing a modified exemplary embodiment of the power amplifier shown in FIG. 6.

FIG. 7 shows a circuit in which variable gain amplifier 1110 and look-up table 1111 are added to the circuit shown in FIG. 6. Look-up table 1111 generates signals for controlling a gain of variable gain amplifier 1110 and an output voltage of voltage control device 1108 on the basis of control signal 1103.

Variable gain amplifier 1110 amplifies envelope signal 1102 by a gain that is determined by a control signal from look-up table 1111, and then outputs the amplified signal to AD converter 1105. Here in the circuit shown in FIG. 7, it is preferable to adjust a value of control signal 1103 so that modulation signal 1109 becomes a desired power. To be more specific, it is preferable that the product of a change ratio of the gain of variable gain amplifier 1110 and a change ratio of the power amplitude of switching amplifier 1106 is permitted to be constant. Like this, by controlling the gain with look-up table 1111, it is possible to improve the efficiency of voltage control device 1108 and to easily reduce the noise.

In the power amplifier of this exemplary embodiment, when the modulation scheme of the high frequency modulation signal, which is an object of the amplification, is dynamically changed, it is preferable to adjust the average power of envelope signal 302 whenever the modulation scheme is changed. To be more specific, it is preferable that the amplitude of envelope signal 302 not exceed an input dynamic range of AD converter 305.

Further, in the power amplifier of this exemplary embodiment, it may be possible to input a high frequency modulation signal including a phase-modulated component and an amplitude modulation component into high frequency amplifier 304. In this case, the power amplifier of this exemplary embodiment operates in a well-known method called as an envelope tracking.

In the above description, it has been described that envelope signal 302 is converted into a bit stream signal using PDM (Pulse Density Modulation) by AD converter 305. However, AD converter 305 may be any circuit as long as it pulse-modulates (AD converts) an envelope signal. For example, a PWM (Pulse Width Modulation) modulator or PFM (Pulse Frequency Modulation) modulator may be used. As high frequency amplifier 304, a high efficiency power amplifier of C-grade, D-grade, E-grade, F-grade and the like may be used.

EXAMPLE

First Example

Figure 8:
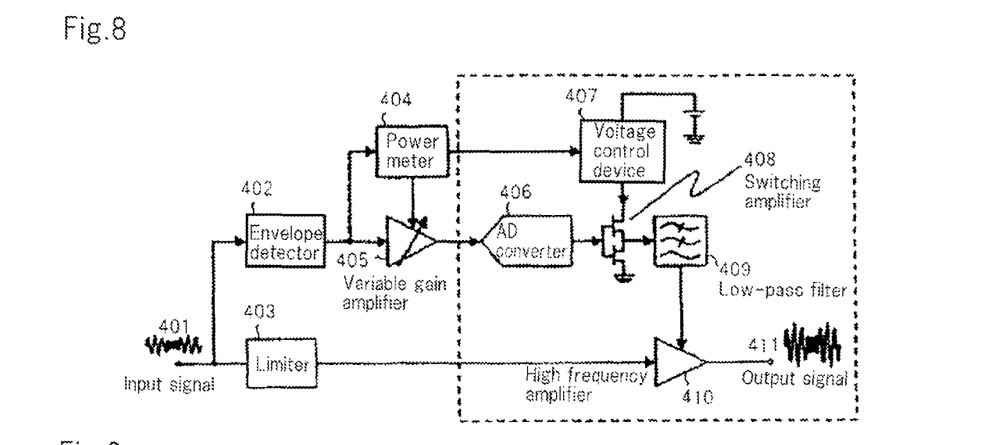
FIG. 8 is a block diagram showing a structure of a power amplifier according to a first example.

As shown in FIG. 8, a high frequency amplifier of a first example has envelope detector 402, limiter 403, power meter 404, variable gain amplifier 405, AD converter 406, voltage control device 407, switching amplifier 408, low-pass filter 409 and high frequency amplifier 410.

The power amplifier of the first example has a structure such that a part encompassed by broken lines in FIG. 8 is the same as the power amplifier shown in FIG. 6. The part operates in the same method as the power amplifier shown in FIG. 6. An output signal from limiter 403 corresponds to phase-modulated signal 301 shown in FIG. 6, an output signal from variable gain amplifier 405 corresponds to envelope signal 302 shown in FIG. 6 and a signal to be outputted to voltage control device 407 from power meter 404 corresponds to control signal 303 shown in FIG. 6.

Signal 401 inputted to the power amplifier shown in FIG. 8 is inputted to limiter 403 and envelope detector 402. The signal inputted to limiter 403 is converted into a phase-modulated signal having a constant envelope, which is then outputted to high frequency amplifier 410.

In the meantime, an envelope signal that is an envelope component of the high frequency signal is extracted from the signal inputted to envelope signal 402, amplified by variable gain amplifier 405 AD converter 406, switching amplifier 408 and low-pass filter 409 and then outputted to high frequency amplifier 410 as a power supply voltage. In addition, the output signal from envelope detector 402 is also inputted to power meter 404. Power meter 404 measures the average power of the output signal form envelope detector 402, and outputs a control signal for determining a gain to variable gain amplifier 405 and a control signal for controlling an output voltage to voltage control device 407.

The output signal from voltage control device 407 is supplied to switching amplifier 408 as a power supply. High frequency amplifier 410 multiplies an output signal from limiter 403 by an output signal from low-pass filter 409 and generates output signal 411 after having synthesized the signals.

In the power amplifier of the first example, power meter 4034 measures the average power of the output signal (envelope signal) from envelope detector 402, and variable gain amplifier 405 amplifies the envelope signal into a magnitude capable of most efficiently using an input dynamic range of AD converter 406. In other words, the power control device consisting of power meter 404 and variable gain amplifier 405 permits the average power of the input signal to AD converter 406 to be constant. Accordingly, ideally, even when the average power of input signal 401 is changed, the average power of the output signal from variable gain amplifier 405 is not changed.

Furthermore, in the power amplifier of the first example, the average power of output signal 411 is adjusted by controlling the gain of switching amplifier 408. Due to this, when the gain of the power amplifier of this example is permitted to be constant, the product of the gain of variable gain amplifier 405 and the gain of switching amplifier 408 is always constant. The gain of switching amplifier 408 is adjusted by the output voltage from voltage control device 407.

In the power amplifier of the first example, ideally, the SNR of modulation signal 411 is not changed depending on the average power thereof. This is because the SNR of the output signal from AD converter 406 is not changed depending on the average power of the input signal thereof.

Also in the power amplifier of the first example, likewise the power amplifier shown in FIG. 6, the average power of the input signal to AD converter 406 may be changed into a step or saw shape in a predetermined range in accordance with desired output powers, by using a control circuit having a look-up table, for example. An example of a structure having the look-up table is shown in FIG. 9.

Figure 9:
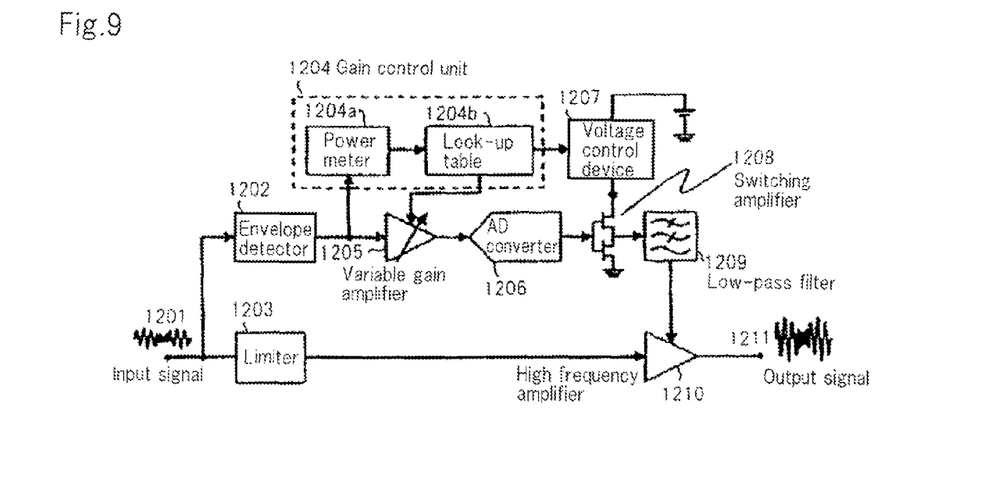
FIG. 9 is a block diagram showing a modified exemplary embodiment of the power amplifier of the first exemplary embodiment shown in FIG. 8.

In the circuit shown in FIG. 9, power meter 404 provided to the power amplifier of the first example shown in FIG. 8 is replaced with gain control unit 1204.

Gain control unit 1204 has power meter 1204a and look-up table 1204b and generates a control signal for controlling a gain of variable gain amplifier 1205 and an output voltage from voltage control device 1207 on the basis of an output signal from envelope detector 1202.

In the circuit shown in FIG. 9, it is preferable to adjust a gain of switching amplifier 1208 so that output signal 1211 from the power amplifier becomes a desired power. To be more specific, it is preferable to permit the product of the gain of variable gain amplifier 1205 and the gain of switching amplifier 1208 to be constant.

Figure 10:
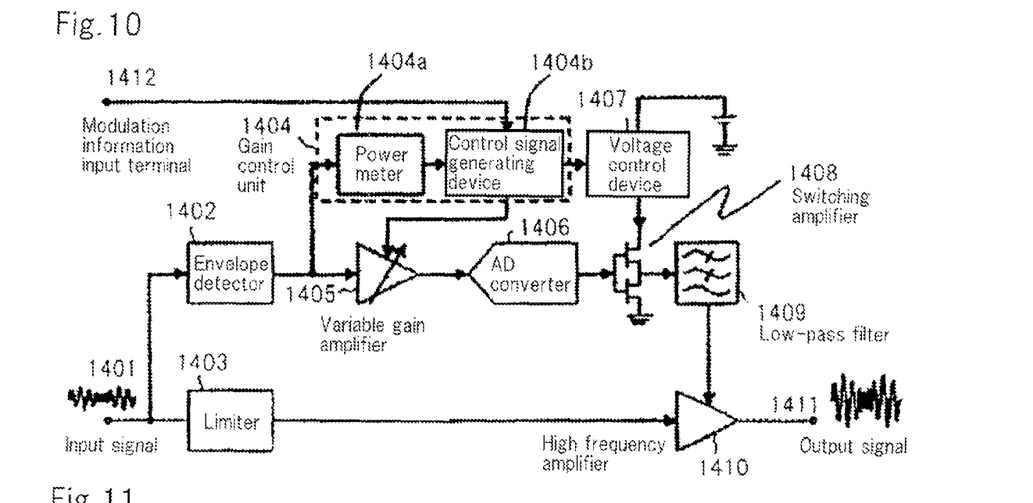
FIG. 10 is a block diagram showing another modified exemplary embodiment of the power amplifier shown in FIG. 9.

Further, in the power amplifier of this example, when the modulation scheme of the high frequency modulation signal, which is an object of the amplification, is dynamically changed, it is preferable to adjust the average power of the input signal to AD converter 406 whenever the modulation scheme is changed. To be more specific, it is preferable that the input signal to AD converter 406 not exceed the input dynamic range of AD converter 406. Due to this, it is desirable to provide power meter 404 with a function of measuring the PAPR of an input signal, or a control signal generating device that generates a control signal of the voltage control device based on information of the modulation scheme inputted from the outside. Such a circuit is realized by replacing look-up table 1204b shown in FIG. 9 with control signal generating device 1404b that has a modulation information input terminal, as shown in FIG. 10.

Control signal generating device 1404b has modulation information input terminal 1412 and controls a gain of variable gain amplifier 1405 and an output voltage from voltage control device 1407, based on information from the outside. In this case, it is preferable that control signal generating device 1404b has a look-up table showing a correspondence relation between a modulation scheme of a signal to be amplified and a control signal to be generated.

Second Example

Figure 11:
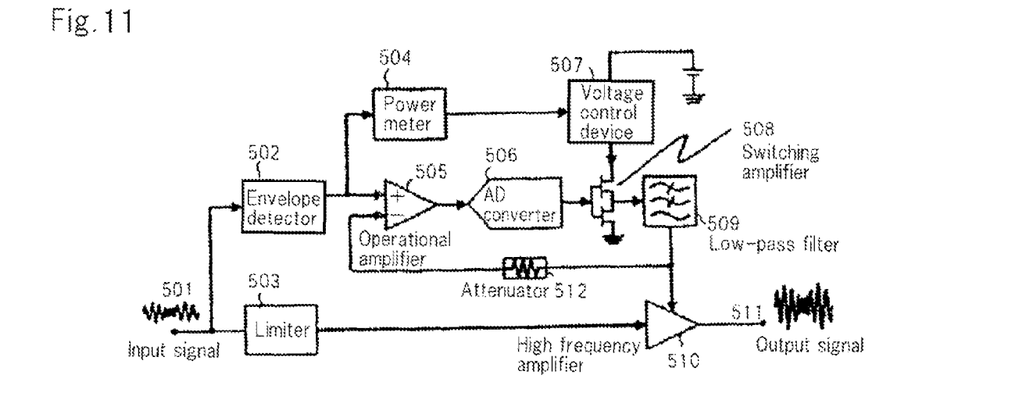
FIG. 11 is a block diagram showing a structure of a power amplifier according to a second exemplary embodiment.

As shown in FIG. 11, a high frequency amplifier of a second example has envelope detector 502, limiter 503, power meter 504, operational amplifier 505, AD converter 506, voltage control device 507, switching amplifier 508, low-pass filter 509, high frequency amplifier 510 and attenuator 512.

Signal 501 inputted to the power amplifier shown in FIG. 11 is supplied to limiter 503 and envelope detector 502. The signal inputted to limiter 503 is converted into a signal having a constant envelope, which is then outputted to high frequency amplifier 510.

In the meantime, only an envelope component of the high frequency signal is extracted from the signal inputted to envelope detector 502, amplified by a non-inverting input of operational amplifier 505, AD converter 506, switching amplifier 508 and low-pass filter 509 and is then outputted to high frequency amplifier 510 as a power supply voltage. The output signal from low-pass filter 509 is returned to an inverting input of operational amplifier 505 via attenuator 512. In addition, the output signal from envelope detector 502 is also inputted to power meter 504.

Power meter 504 measures an average power of the output signal from envelope detector 502 and outputs a signal for determining an output voltage to voltage control device 507. The output signal from voltage control device 507 is supplied to switching amplifier 508 as a power supply. High frequency amplifier 510 multiplies an output signal from limiter 503 by an output signal from low-pass filter 509 and generates output signal 511 after having synthesized the signals.

In the power amplifier of the second example, variable gain amplifier 405 provided to the power amplifier of the first example shown in FIG. 8 is replaced with operational amplifier 505.

Also in the power amplifier of the second example, as in the first example, operational amplifier 505 amplifies the envelope signal into a magnitude capable of most efficiently using an input dynamic range of AD converter 506. In other words, the power control device consisting of power meter 504 and operational amplifier 505 permits the average power of the input signal to AD converter 506 to be constant. In this way, by adjusting the magnitude of the input signal (envelope signal) to AD converter 506, it is possible to improve the SNR of the output signal from the power amplifier. Here, the product of the gain of operational amplifier 505 and the gain of switching amplifier 508 is permitted to be always constant by using a feedback circuit including attenuator 512. Hence, the gain of operational amplifier 505 is automatically adjusted when the gain of switching amplifier 508 is determined. The gain of switching amplifier 508 is adjusted by measuring the average power of the output signal (envelope signal) from envelope detector 502 with power meter 504 and changing the output voltage from voltage control device 507.

Also in the power amplifier of the second example, as in the power amplifier shown in FIG. 6, the average power of the input signal to AD converter 506 may be changed into a step or saw shape in a predetermined range in accordance with desired output powers, by using a control circuit having a look-up table, for example. An example of a structure having the look-up table is shown in FIG. 12.

Figure 12:
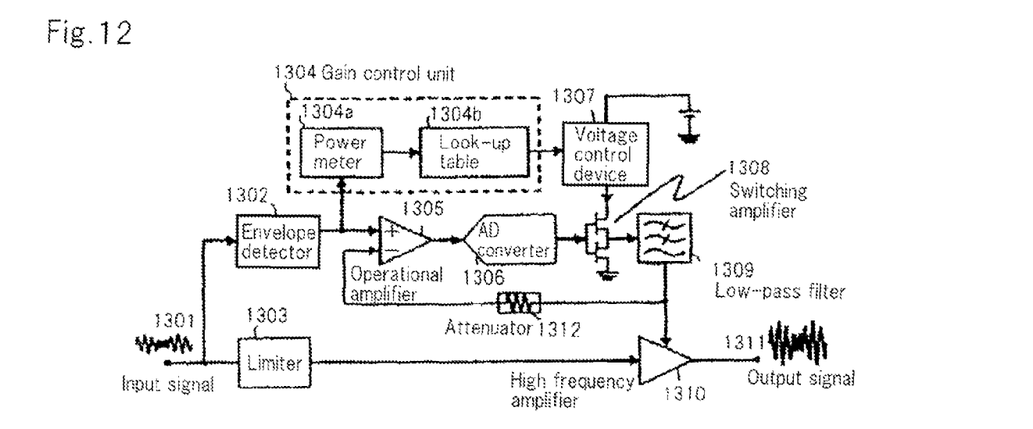
FIG. 12 is a block diagram showing a modified exemplary embodiment of the power amplifier of the second exemplary embodiment shown in FIG. 11.

In the circuit shown in FIG. 12, power meter 504 provided to the power amplifier of the second example is replaced with gain control unit 1304.

Gain control unit 1304 has power meter 1304a and look-up table 1304b and generates a control signal for controlling an output voltage from voltage control device 1307 on the basis of an output signal from envelope detector 1302. In the circuit shown in FIG. 12, when a gain of switching amplifier 1308 is adjusted, the average power of a signal to be inputted to AD converter 1306 by a negative feedback circuit of operational amplifier 1305 is changed.

Meantime, in the power amplifier of the second example, when the modulation scheme of the high frequency modulation signal, which is an object of the amplification, is dynamically changed, it is preferable to adjust the average power of the input signal to AD converter 506 whenever the modulation scheme is changed. To be more specific, it is preferable that the input signal to AD converter 506 not exceed the input dynamic range of AD converter 506. Due to this, it is desirable to provided power meter 504 with a function of measuring the PAPR of an input signal, or a control signal generating device that generates a control signal of the voltage control device based on information of the modulation scheme inputted from the outside. Such a circuit may be realized by replacing look-up table 1304b shown in FIG. 12 with control signal generating device 1404b that has a modulation information input terminal, as in the first example.

Third Example

Figure 13:
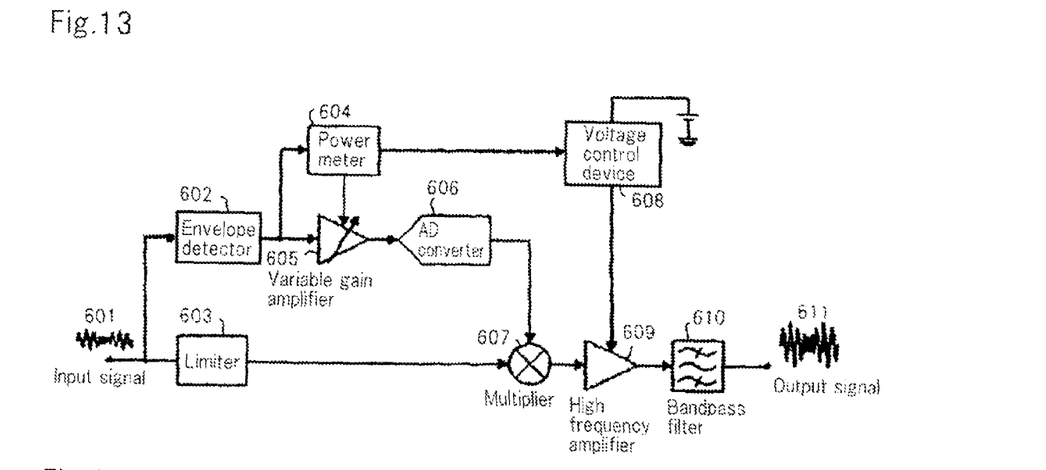
FIG. 13 is a block diagram showing a structure of a power amplifier according to a third exemplary embodiment.

As shown in FIG. 13, a power amplifier of a third example has envelope detector 602, limiter 603, power meter 604, variable gain amplifier 605, AD converter 606, multiplier 607 of 2-ports input, voltage control device 608, high frequency amplifier 609 and bandpass filter 610.

Signal 601 inputted to the power amplifier shown in FIG. 13 is supplied to limiter 603 and envelope detector 602. The signal inputted to limiter 603 is converted into a signal having a constant envelope, which is then outputted to a first input terminal of multiplier 607.

In the meantime, only an envelope component of the high frequency signal is extracted from the signal inputted to envelope detector 502, and then outputted to variable gain amplifier 605 and power meter 604. The envelope signal inputted to variable gain amplifier 605 is amplified and then inputted to a second input terminal of multiplier 607 via AD converter 606. The two signals inputted to multiplier 607 are multiplied and then outputted to high frequency amplifier 609.

High frequency amplifier 609 amplifies the output signal from multiplier 607. The signal amplified in high frequency amplifier 609 becomes output signal 611 after unnecessary out-of band noise is removed by bandpass filter 610.

Power meter 604 measures the average power of the output signal from envelope detector 602 and outputs a signal for determining a gain to variable gain amplifier 605 and a signal for determining an output voltage to voltage control device 608. The output signal from voltage control device 608 is supplied to high frequency amplifier 609 as a power supply.

In the power amplifier of the third example, multiplier 607 inputs to high frequency amplifier 609 the product of the phase-modulated signal outputted from limiter 603 and the envelope signal outputted from AD converter 606. The envelope signal is converted into a bit stream signal by A/D converter 606. Due to this, the output signal from multiplier 607 is the product of the signal of "1" or "0" and the phase-modulated signal and becomes a burst-type signal. High frequency amplifier 609 that amplifies the output signal from multiplier 607 is designed to operate in a saturation state when a signal is inputted. As a result, high frequency amplifier 609 repeats an idle operation and a saturation output state, and ideally, the efficiency is same as that of the saturation state.

In the power amplifier of the third example, power meter 604 measures the average power of the output signal (envelope signal) from envelope detector 602, and variable gain amplifier 605 amplifies the envelope signal into a magnitude capable of most efficiently using an input dynamic range of AD converter 606. In other words, the power control device consisting of power meter 604 and variable gain amplifier 605 permits the average power of the input signal to AD converter 606 to be constant. Accordingly, ideally, even when the average power of input signal 601 is changed, the average power of the output signal from variable gain amplifier 605 is not changed.

Furthermore, in the power amplifier of the third example, the average power of output signal 611 is adjusted by changing the gain of high frequency amplifier 609. Due to this, when the gain of the power amplifier shown in FIG. 13 is permitted to be constant, the product of the gain of variable gain amplifier 605 and the gain of high frequency amplifier 609 is always constant. In the power amplifier of this example, since high frequency amplifier 609 operates in a saturation state, the gain thereof is adjusted by changing the power supply voltage to be supplied from voltage control device 608.

In the power amplifier structured as described above, ideally, the SNR of modulation signal 611 is not changed depending on the average power. This is because the SNR of the output signal from AD converter 606 is not changed depending on the average power of the input signal thereof.

In the meantime, in the power amplifier of the third example, as in the power amplifier shown in FIG. 6, it may be possible to omit envelope detector 602, limiter 603, power meter 604 and variable gain amplifier 605, the phase-modulated signal is directly inputted to multiplier 607, the envelope signal is directly inputted to AD converter 606 and the control signal of the output power is directly inputted to voltage control device 608.

Furthermore, in the power amplifier of the third example, the average power of the input signal to AD converter 606 may be changed into a step or saw shape in accordance with desired output powers, by using a look-up table. In this case, as in the first example, power meter 604 may be replaced with a gain control unit having a power meter and a took-up table. At this time, it is preferable to adjust a gain of high frequency amplifier 609 so that an amplitude of an output signal from the power amplifier becomes a desired power. To be more specific, it is preferable to permit the product of the gain of variable gain amplifier 605 and the gain of high frequency amplifier 609 to be constant.

Further, in the power amplifier of the third example, when the modulation scheme of the high frequency modulation signal, which is an object of the amplification, is dynamically changed, it is preferable to adjust the average power of the input signal to AD converter 606 whenever the modulation scheme is changed. To be more specific, it is preferable that the input signal to AD converter 606 not exceed the input dynamic range of AD converter 606. Due to this, it is desirable to provide power meter 604 with a function of measuring the PAPR of an input signal, or a control signal generating device that generates a control signal of the voltage control device based on information of the modulation scheme inputted from the outside. Such a circuit may be realized by replacing the look-up table with a control signal generating device having a modulation information input terminal, as in the first example.

Fourth Example

Figure 14:
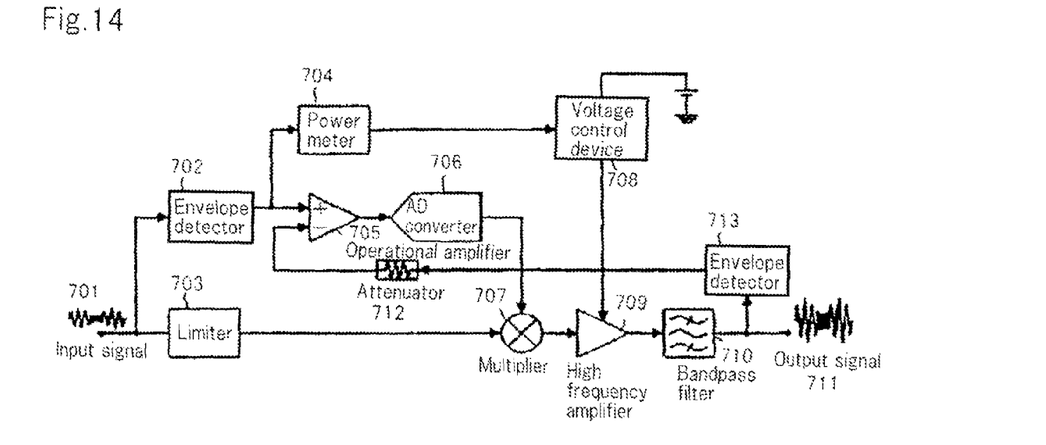
FIG. 14 is a block diagram showing a structure of a power amplifier according to a fourth exemplary embodiment.

As shown in FIG. 14, a power amplifier of a fourth example has envelope detector 702, limiter 703, power meter 704, operational amplifier 705, AD converter 706, multiplier 707, voltage control device 708, high frequency amplifier 709, bandpass filter 710, attenuator 712 and envelope detector 713.

Signal 701 inputted to the power amplifier shown in FIG. 14 is supplied to limiter 703 and envelope detector 702. The signal inputted to limiter 703 is converted into a signal having a constant envelope, which is then outputted to a first input terminal of multiplier 707.

In the meantime, only an envelope component of the high frequency signal is extracted from the signal inputted to envelope detector 702, and then outputted to a non-inverting input terminal of operational amplifier 705 and power meter 704. The envelope signal inputted to the non-inverting input terminal of operational amplifier 705 is amplified and then inputted to a second input terminal of multiplier 707 via AD converter 706. The two signals inputted to multiplier 707 are multiplied and then outputted to high frequency amplifier 709.

High frequency amplifier 709 amplifies the output signal from multiplier 707. The signal amplified in high frequency amplifier 709 is outputted as modulation signal 711 after an unnecessary frequency component thereof is removed by bandpass filter 710. Envelope detector 713 extracts an envelope component of modulation signal 711 and returns it to an inverting input terminal of operational amplifier 705 via attenuator 712.

Power meter 704 measures an average power of the output signal from envelope detector 702 and outputs to voltage control device 708 a signal for determining an output voltage. The output signal from voltage control device 708 is supplied to high frequency amplifier 709 as a power supply.

The fourth example has a structure such that variable gain amplifier 605 of the power amplifier of the third example shown in FIG. 13 is replaced with operational amplifier 705. Also in the fourth example as in the second example, operational amplifier 705 amplifies the envelope signal into a magnitude capable of most efficiently using the input dynamic range of AD converter 706. In other words, the power control device consisting of power meter 704 and operational amplifier 705 permits the average power of the input signal to AD converter 706 to be constant. Like this, by adjusting the magnitude of the input signal (envelope signal) to AD converter 706, it is possible to improve the SNR of the output signal from the power amplifier. Here, the product of the gain of operational amplifier 705 and the gain of high frequency amplifier 709 is permitted to be always constant by using a feedback circuit including attenuator 712. Hence, the gain of operational amplifier 705 is automatically adjusted when the gain of high frequency amplifier 709 is determined. The gain of high frequency amplifier 709 is adjusted by measuring the average power of the output signal (envelope signal) from envelope detector 702 with power meter 704 and changing the output voltage from voltage control device 708.

Also in the power amplifier of the fourth example, as in the power amplifier shown in FIG. 6, the average power of the input signal to AD converter 706 may be changed into a step or saw shape in accordance with desired output powers, by using a look-up table. In this case, as in the second example, power meter 704 may be replaced with a gain control unit having a power meter and a look-up table. At this time, when the gain of high frequency amplifier 709 is adjusted, the average power of the input signal to AD converter 706 is changed by the negative feedback of operational amplifier 705.

Further, in the power amplifier of the fourth example, when the modulation scheme of the high frequency modulation signal, which is an object of the amplification, is dynamically changed, it is preferable to adjust the average power of the input signal to AD converter 706 whenever the modulation scheme is changed. To be more specific, it is preferable that the input signal to AD converter 706 not exceed the input dynamic range of AD converter 706. Due to this, it is desirable to provide power meter 704 with a function of measuring the PAPR of an input signal, or a control signal generating device that generates a control signal of the voltage control device based on information of the modulation scheme inputted from the outside. Such a circuit may be realized by replacing the look-up table with a control signal generating device having a modulation information input terminal, as in the first example.

Meanwhile, even when the power amplifiers of the first and second examples are made to operate in an envelope tracking method, as the power amplifier shown in FIG. 6, the effect in which the SNR of the output signal from the power amplifier is improved is maintained. In this case, it is preferable to input to the multiplier or high frequency amplifier a high frequency modulation signal including a phase-modulated component and an amplitude modulation component, instead of the phase-modulated signal, by omitting the limiter.

Furthermore, in the first to fourth examples, the envelope signal is converted into a bit stream signal using PDM (Pulse Density Modulation) by the AD converter. However, the AD converter may be any circuit as long as it pulse-modulates (AD converts) an envelope signal. For example, a PWM (Pulse Width Modulation) modulator or PFM (Pulse Frequency Modulation) modulator may be used. In addition, as the high frequency amplifier, a high efficiency amplifier of C-grade, D-grade, E-grade, F-grade and the like may be used.

The invention claimed is:

1. A power amplifier amplifying a high frequency modulation signal including an amplitude modulation component and a phase-modulated component, comprising:
   an AD (Analog to Digital) converter pulse modulating an envelope signal that is the amplitude modulation component;
   a switching amplifier amplifying an output signal from the AD converter;
   a low-pass filter removing high frequency noise from an output signal from the switching amplifier;
      a voltage control device supplying a power supply voltage to the switching amplifier and changing the power supply voltage in accordance with a control signal from the outside;
   a high frequency amplifier having an output signal from the low-pass filter as a power supply and synthesizing and outputting the output and input signals of the low-pass filter; and
      a power control device permitting an average power of an input signal to the AD converter to be constant.

2. The power amplifier according to claim 1, wherein the power control device has a gain control unit converting the average power of the input signal to the AD converter in accordance with a modulation scheme of the high frequency modulation signal.

3. The power amplifier according to claim 1, wherein an input signal to the high frequency amplifier is a phase-modulated signal having a constant envelope but not the amplitude modulation component, and
   wherein the high frequency amplifier outputs a signal obtained by multiplying the output signal from the low-pass filter by the phase-modulated signal.

4. The power amplifier according to claim 1, wherein an input signal to the high frequency amplifier is a high frequency modulation signal including the phase-modulated component and the amplitude modulation component.

5. The power amplifier according to claim 3, further comprising: an envelope detector extracting the envelope signal from the high frequency modulation signal; and
   a limiter extracting the phase-modulated signal from the high frequency modulation signal and outputting the extracted signal to the high frequency amplifier,
   wherein the power control device comprises:
   a variable gain amplifier amplifying an output signal from the envelope detector by a desired gain to be determined by a control signal from the outside and outputting the amplified signal to the AD converter; and
   a power meter generating a control signal for setting a gain of the variable gain amplifier and a control signal for setting an output voltage from the voltage control device, based on the output signal from the envelope detector.

6. The power amplifier according to claim 4, further comprising an envelope detector extracting the envelope signal from the high frequency modulation signal;
   wherein the power control device comprises:
   a variable gain amplifier amplifying an output signal from the envelope detector by a desired gain to be determined by a control signal from the outside and outputting the amplified signal to the AD converter; and
   a power meter generating a control signal for setting a gain of the variable gain amplifier and a control signal for setting an output voltage from the voltage control device, based on the output signal from the envelope detector.

7. The power amplifier according to claim 3, further comprising an envelope detector extracting the envelope signal from the high frequency modulation signal; and
   a limiter extracting the phase-modulated signal from the high frequency modulation signal and outputting the extracted signal to the high frequency amplifier,
   wherein the power control device comprises:
   an attenuator attenuating a level of an output signal from the low-pass filter;
   a operational amplifier having a non-inverting input terminal to which an output signal from the envelope detector is inputted and an inverting input terminal to which an output signal from the attenuator is inputted; and
   a power meter generating a control signal for setting an output voltage from the voltage control device, based on the output signal from the envelope detector.

8. The power amplifier according to claim 4, further comprising an envelope detector extracting the envelope signal from the high frequency modulation signal;
   wherein the power control device comprises:
   an attenuator attenuating a level of an output signal from the low-pass filter;
   a operational amplifier having a non-inverting input terminal to which an output signal from the envelope detector is inputted and an inverting input terminal to which an output signal from the attenuator is inputted; and
   a power meter generating a control signal for setting an output voltage from the voltage control device, based on the output signal from the envelope detector.

9. A power amplifier amplifying a high frequency modulation signal including an amplitude modulation component and a phase-modulated component, comprising:
   an AD converter pulse modulating an envelope signal that the amplitude modulation component;
   a multiplier synthesizing a phase-modulated signal having a constant envelope that is the phase-modulated component and an output signal from the AD converter;
   a high frequency amplifier amplifying an output signal from the multiplier;
   a bandpass filter removing out-of-band noise from an output signal from the high frequency amplifier; and
   a voltage control device supplying a power supply voltage to the high frequency amplifier and changing the power supply voltage in accordance with a control signal for controlling an average power of an output signal from the high frequency amplifier, the control signal being supplied from the outside.

10. The power amplifier according to claim 9, further comprising power control device permitting an average power of an input signal to the AD converter to be constant.

11. The power amplifier according to claim 10, wherein the power control device has a gain control unit converting the average power of the input signal to the AD converter in accordance with a modulation scheme of the high frequency modulation signal.

12. The power amplifier according to claim 9, further comprising: an envelope detector extracting the envelope signal from the high frequency modulation signal; and
   a limiter extracting the phase-modulated signal from the high frequency modulation signal and outputting the extracted signal to the multiplier,
   wherein the power control device comprises:
   a variable gain amplifier amplifying an output signal from the envelope detector by a desired gain to be determined by a control signal from the outside and outputting the amplified signal to the AD converter; and a power meter generating a control signal for setting a gain of the variable gain amplifier and a control signal for setting an output voltage from the voltage control device, based on the output signal from the envelope detector.

13. The power amplifier according to claim 9, further comprising a first envelope detector extracting the envelope signal from the high frequency modulation signal;

a second envelope detector extracting an envelope signal representing an envelope of an output signal from the bandpass filter; and a limiter extracting the phase-modulated signal from the high frequency modulation signal and outputting the extracted signal to the multiplier, wherein the power control device comprises:

an attenuator attenuating a level of an output signal from the second envelope detector;

an operational amplifier having a non-inverting input terminal to which an output signal from the first envelope detector is inputted and an inverting input terminal to which an output signal from the attenuator is inputted; and a power meter generating a control signal for setting an output voltage from the voltage control device, based on the output signal from the second envelope detector.

14. A power amplifying method for amplifying a high frequency modulation signal including an amplitude modulation component and a phase-modulated component, comprising:

pulse modulating an envelope signal that is the amplitude modulation component in an AD (Analog to Digital) converter while controlling an average power of an input signal to the AD converter to be constant;

amplifying an output signal from the AD converter in a switching amplifier having a power supply voltage that is changed in accordance with a control signal from the outside;

enabling an output signal from the switching amplifier to pass through a low-pass filter, thereby removing high frequency noise; and synthesizing an output signal from the low-pass filter and an input signal in a high frequency amplifier having the output signal from the low-pass filter as a power supply, thereby obtaining a high frequency modulation signal after the amplification, the input signal being a high frequency modulation signal including at least the amplitude modulation component.

15. A power amplifying method for amplifying a high frequency modulation signal including an amplitude modulation component and a phase-modulated component, comprising:

pulse modulating an envelope signal that is the amplitude modulation component in an AD converter;

synthesizing a phase-modulated signal having a constant envelope that is the amplitude modulation component and an output signal from the AD converter with a multiplier;

amplifying an output signal from the multiplier in a high frequency amplifier having a power supply voltage that is changed in accordance with a control signal for controlling an average power of an output signal from the high frequency amplifier, the control signal being supplied from the outside; and removing out-of-band noise from the output signal from the high frequency amplifier in a bandpass filter.

* * * * *